(12) United States Patent
Snyder et al.

(10) Patent No.: US 9,147,822 B2
(45) Date of Patent: Sep. 29, 2015

(54) HEAVILY DOPED PBSE WITH HIGH THERMOELECTRIC PERFORMANCE

(75) Inventors: G. Jeffrey Snyder, Pasadena, CA (US); Heng Wang, Pasadena, CA (US); Yanzhong Pei, Arcadia, CA (US)

(73) Assignee: California Institute of Technology, Pasadena, CA (US)

( * ) Notice: Subject to any disclaimer, the term of this patent is extended or adjusted under 35 U.S.C. 154(b) by 260 days.

(21) Appl. No.: 13/282,383

(22) Filed: Oct. 26, 2011

(65) Prior Publication Data

US 2012/0097906 A1    Apr. 26, 2012

Related U.S. Application Data

(60) Provisional application No. 61/406,629, filed on Oct. 26, 2010.

(51) Int. Cl.
*H01L 35/16* (2006.01)
*H01L 35/00* (2006.01)
*C01B 19/00* (2006.01)

(52) U.S. Cl.
CPC .............. *H01L 35/16* (2013.01); *C01B 19/002* (2013.01); *C01P 2002/54* (2013.01); *C01P 2006/10* (2013.01); *C01P 2006/40* (2013.01)

(58) Field of Classification Search
CPC . H01L 35/16; H01L 31/0272; C01P 2006/40; C01P 2006/10; C01P 2002/52; C01B 19/002; C01B 19/007
USPC ................. 252/62.3 T, 62.3 S, 519.4, 519.14; 136/200; 423/508–510
See application file for complete search history.

(56) References Cited

U.S. PATENT DOCUMENTS 3,574,140 A * 4/1971 Schoolar et al. ........... 252/501.1
2004/0107988 A1 * 6/2004 Harman et al. ............... 136/205
2006/0249704 A1 * 11/2006 Ren et al. ................... 252/62.3 T
2009/0178700 A1 * 7/2009 Heremans et al. ............ 136/201
2009/0269584 A1 * 10/2009 Bell et al. ...................... 428/402

FOREIGN PATENT DOCUMENTS

JP        10022534 A    *  1/1998

OTHER PUBLICATIONS machine translation of JP10022534 A.*
Nemov et al., "Thallium dopant in lead chalcogenides: investigation method and peculiarities", Physics-Uspekhi, vol. 41 (8), 1998, pp. 735-759.*
Alekseeva et al., "Nature of hole localization centers in sodium-doped lead chalcognides", A.F. Ioffe Physicotechical Institute, Russian Academy of Sciences, Semiconductors, vol. 31 (5), May 1997, pp. 446-448.*
Zhukova et al., "Reaction of Electrically Active Dopants in Lead Selenide", 1991, Neorganicheskiye Materialy, vol. 27, No. 5, pp. 908-912 (Russian document).*
Zhukova et al., "Reaction of Electrically Active Dopants in Lead Selenide", 1989 on translation, Neorganicheskiye Materialy, vol. 27, No. 5, pp. 908-912 (English translation).*
Chasapis et al., "Investigation of the valence band structure of PbSe by optical and transport measurement", 2013, Mater. Res. Soc. Symp. Proc., vol. 1490, pp. 75-81.*

* cited by examiner

*Primary Examiner* — Matthew E Hoban
*Assistant Examiner* — Lynne Edmondson
(74) *Attorney, Agent, or Firm* — Seth D. Levy; Brian T. Duke; Nixon Peabody LLP (57) ABSTRACT

The present invention discloses heavily doped PbSe with high thermoelectric performance. Thermoelectric property measurements disclosed herein indicated that PbSe is high zT material for mid-to-high temperature thermoelectric applications. At 850 K a peak zT>1.3 was observed when $n_H \sim 1.0 \times 10^{20}$ cm$^{-3}$. The present invention also discloses that a number of strategies used to improve zT of PbTe, such as alloying with other elements, nanostructuring and band modification may also be used to further improve zT in PbSe.

4 Claims, 8 Drawing Sheets

HEAVILY DOPED PBSE WITH HIGH THERMOELECTRIC PERFORMANCE

CROSS-REFERENCE TO RELATED APPLICATIONS

This application claims priority from U.S. Provisional Patent Application No. 61/406,629, filed on Oct. 26, 2010, which is incorporated herein by reference in its entirety.

GOVERNMENT RIGHTS

The invention described herein was made in the performance of work under a NASA contract, and is subject to the provisions of Public Law 96-517 (35 USC202) in which the Contractor has elected to retain title.

FIELD OF INVENTION

The present invention relates to the use of advanced thermoelectrics for power generation.

BACKGROUND

Thermoelectric power generation is drawing more and more interest in engine exhaust heat recovery to improve fuel efficiency.[1] The development of useful devices requires materials with high dimensionless figure of merit zT ($zT=S^2T/\rho\kappa$, S being Seebeck coefficient, $\rho$ electric resistivity and $\kappa$ thermal conductivity).[2] Among the materials suitable for power generation applications PbTe has been the most studied,[3, 4] including recent results from nanostructuring[5] and band modification[6] with exceptional zT in both n type[7, 8] and p type.[9, 10]

PbSe, closely related to PbTe, is much less frequently considered for thermoelectrics. This can be traced to the smaller band gap and higher thermal conductivity expected from the lighter PbSe compared with PbTe.[11] Importantly, PbSe offers a cheaper alternative to PbTe, as Se is more abundant and the cost is much less than that of Te. Thus, there is a need in the art for PbSe with high thermoelectric performance.

SUMMARY OF THE INVENTION

In certain embodiments, the invention teaches a compound of the formula $A_xPb_{1-x}Se$, wherein A is selected from the group consisting of: Na, Li, K, Rb, Cs, Tl, Au, Ag, and Cu. In some embodiments, A is Na. In some embodiments, $0.005 \leq x \leq 0.02$. In certain embodiments, the composition has a maximum thermoelectric figure of merit (zT) of greater than 1.3 at 850 K.

In certain embodiments, the invention teaches a thermoelectric material including a compound of the formula $A_xPb_{1-x}Se$, wherein A is selected from the group consisting of: Na, Li, K, Rb, Cs, Tl, Au, Ag, and Cu. In some embodiments, A is Na. In some embodiments, $0.005 \leq x \leq 0.02$. In some embodiments, the composition has a maximum thermoelectric figure of merit (zT) of greater than 1.3 at 850 K.

In certain embodiments, the invention teaches a thermoelectric material including a compound of the formula $PbTe_xSe_{1-x}$. In some embodiments, $0 \leq x \leq 1$.

In certain embodiments, the invention teaches a thermoelectric material including a compound of the formula $Pb_{1-x}Sn_xSe$. In some embodiments, $0 \leq x \leq 0.3$.

In certain embodiments, the invention teaches a thermoelectric material including a compound of the formula $Na_xPb_{1-x}Te$, wherein $0.005 \leq x \leq 0.02$. In some embodiments, the composition has a maximum thermoelectric figure of merit (zT) of greater than 1.0 at 750K.

In certain embodiments, the invention teaches a method of manufacturing a compound, including: providing a quantity of Pb; providing a quantity of Se; providing a quantity of an element selected from the group consisting of: Na, Li, K, Rb, Cs, Tl, Au, Ag, and Cu; loading the elements into containers; and melting the elements, followed by quenching, annealing and hot pressing. In some embodiments, the compound is of a formula: $A_xPb_{1-x}Se$, and A is selected from the group consisting of: Na, Li, K, Rb, Cs, Tl, Au, Ag, and Cu. In some embodiments, A is Na. In some embodiments, $0.005 \leq x \leq 0.02$.

In certain embodiments, the invention teaches a method of manufacturing a compound, including: providing a quantity of Na; providing a quantity of Pb; providing a quantity of Te; loading the elements into containers; and melting the elements, followed by quenching, annealing and hot pressing. In some embodiments, the compound is of a formula: $Na_xPb_{1-x}Te$, and $0.005 \leq x \leq 0.02$. In some embodiments, the composition has a maximum thermoelectric figure of merit (zT) of greater than 1.0 at 750K.

In certain embodiments, the invention teaches a thermoelectric material including a compound of the formula $PbSe_{1-x}X_x$, wherein X is selected from the group consisting of: Sb, Bi, As, Sn, and Ge.

DESCRIPTION OF THE INVENTION

All references cited herein are incorporated by reference in their entirety as though fully set forth. Unless defined otherwise, technical and scientific terms used herein have the same meaning as commonly understood by one of ordinary skill in the art to which this invention belongs.

As disclosed herein, polycrystalline PbSe doped with Na were prepared. Thermoelectric property measurements indicated that PbSe is high zT material for mid-to-high temperature thermoelectric applications. At 850 K a peak zT>1.3 was observed when $n_H$~$1.0 \times 10^{20}$ cm$^{-3}$. The high zT originates from the large effective band gap at high temperature and low lattice thermal conductivity comparable to PbTe. In addition, significant non single parabolic band behavior is observed which is likely to enhance the transport properties for thermoelectric applications. Results disclosed herein demonstrate that PbSe is a good thermoelectric material. As also disclosed herein, many strategies used to improve zT of PbTe, such as alloying with other elements, nanostructuring and band modification are also very likely to be useful to further increase zT in PbSe.

As further disclosed herein, p-type PbTe materials with high doping levels of Na were prepared, and the electrical properties were determined to be consistent with previously reported results. Both the experimental results and the theoretical calculations suggest that the electronic transport properties of these samples are heavily influenced by a high DOS near the Fermi level, leading to holes with heavy effective mass. These heavy mass carriers lead to a large Seebeck coefficient (compared to n-type PbTe) and high thermoelectric figure of merit of ~1.0 at ~750 K. The high zT observed is intrinsic to PbTe and is likely to contribute to the high zT observed in related p-type PbTe-based systems such as PbTe:Tl and nanostructured materials.

As further disclosed herein, the presence of a sharp increase in density of states near the Fermi Level is a beneficial characteristic in some high zT materials. As this is a purely electronic effect, reductions in the lattice thermal conductivity, through nanostructuring for example, is likely to lead to further improvements in zT.

Unless otherwise stated, carrier density and carrier concentration are used interchangeably in the instant disclosure.

In some embodiments, the numbers expressing quantities of ingredients, properties such as molecular weight, reaction conditions, and so forth, used to describe and claim certain embodiments of the application are to be understood as being modified in some instances by the term "about." Accordingly, in some embodiments, the numerical parameters set forth in the written description and attached claims are approximations that can vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

In some embodiments, the present invention teaches a compound of the formula $A_xPb_{1-x}Se$, wherein "A" is selected from the group consisting of: Na, Li, K, Rb, Cs, Tl, Au, Ag, and Cu. Other substitutional defects producing p-type conductivity include $PbSe_{1-x}X_x$ where X is selected from the group consisting of: Sb, Bi, As, Sn, and Ge. One of skill in the art would readily appreciate that other elements with similar characteristics of heavily doping the material p-type, such as alloys with Sn or Ge that induce p-type defects, could be substituted for those disclosed herein. In some embodiments, "A" is Na. In certain embodiments, $0.005 \leq x \leq 0.02$. In some embodiments, the composition has a maximum thermoelectric figure of merit (zT) of greater than 1.3 at 850 K.

In certain embodiments, the present invention teaches a thermoelectric material including a compound of the formula $A_xPb_{1-x}Se$, wherein "A" is selected from the group consisting of: Na, Li, K, Rb, Cs, Tl, Au, Ag, and Cu. Other substitutional defects producing p-type conductivity include $PbSe_{1-x}X_x$ where X is selected from the group consisting of: Sb, Bi, As, Sn, and Ge. One of skill in the art would readily appreciate that other elements with similar characteristics of heavily doping the material p-type, such as alloys with Sn or Ge that induce p-type defects, could be substituted for those disclosed herein. In some embodiments, "A" is Na. In certain embodiments, $0.005 \leq x \leq 0.02$. In some embodiments, the composition has a maximum thermoelectric figure of merit (zT) of greater than 1.3 at 850 K.

In some embodiments, the invention discloses a thermoelectric material including a compound of the formula $PbTe_xSe_{1-x}$. In certain embodiments, $0 \leq x \leq 1$.

In some embodiments, the invention discloses a thermoelectric material including a compound of the formula $Pb_{1-x}Sn_xSe$. In certain embodiments, $0 \leq x \leq 0.3$.

In some embodiments, the invention discloses a thermoelectric material including a compound of the formula $Na_xPb_{1-x}Te$. In some embodiments, $0.005 \leq x \leq 0.02$. In some embodiments, the composition has a maximum thermoelectric figure of merit (zT) of greater than 1.0 at 750K. In some embodiments, nanostructuring is used to further increase zT.

In certain embodiments, the invention discloses a method of manufacturing a compound, including: providing a quantity of Pb; providing a quantity of Se; providing a quantity of an element selected from the group consisting of: Na, Li, K, Rb, Cs, Tl, Au, Ag, and Cu; loading the elements into containers; and melting the elements, followed by quenching, annealing and hot pressing. In certain embodiments, the compound is of a formula including $A_xPb_{1-x}Se$. In some embodiments, "A" is selected from the group consisting of: Na, Li, K, Rb, Cs, Tl, Au, Ag, and Cu. In some embodiments, "A" is Na. One of skill in the art would readily appreciate that other elements with similar characteristics could be substituted for those described herein. In certain embodiments, $0.005 \leq x \leq 0.02$.

In some embodiments, all of the elements of the compound are loaded into sealed quartz ampoules and melted at 1,400 K for 6 hours. Afterwards, the ampoules are quenched in water and annealed at 950 K for 60 hours. Ground powders are then loaded into graphite dies and hot pressed at 873 K (40 MPa) under argon for 30 minutes. In certain embodiments, the compound is of a formula comprising $A_xPb_{1-x}Se$. In some embodiments, "A" is selected from the group consisting of: Na, Li, K, Rb, Cs, Tl, Au, Ag, and Cu. In some embodiments, "A" is Na. One of skill in the art would readily appreciate that other elements with similar characteristics could be substituted for those disclosed herein. In certain embodiments, $0.005 \leq x \leq 0.02$.

One of skill in the art would readily appreciate the elements could alternatively be melted at a variety of different temperatures for different amounts of time. Merely by way of example, melting could be performed at between 600 K and 1500 K for between 0.5 and 24 hours. One of skill in the art would similarly appreciate that annealing can be accomplished at a variety of different possible temperatures for different amounts of time. For example, at temperatures ranging from 600 K to 1200 K for between 1 and 120 hours. Hot pressing can also be accomplished at a range of temperatures and for different amounts of time. For example, the temperature could be between 700 K and 1000 K for between 10 and 120 minutes.

In some embodiments, the invention discloses a method of manufacturing a compound, including: providing a quantity of Na; providing a quantity of Pb; providing a quantity of Te; loading the elements into containers; and melting the elements, followed by quenching, annealing and hot pressing. In some embodiments, the compound is of a formula including $Na_xPb_{1-x}Te$, wherein $0.005 \leq x \leq 0.02$. In some embodiments, the composition has a maximum thermoelectric figure of merit (zT) of greater than 1.0 at 750K. One of skill in the art would readily appreciate that other elements with similar characteristics could be substituted for those disclosed herein.

In some embodiments of the invention, compounds are manufactured by melting, annealing and hot-pressing. Stoichiometric mixtures of high purity Na (99%), Pb (99.999%) and Te (99.9999%) ingots are sealed in graphite coated ampoules under vacuum and heated to 1,273 K at ~500K/hour. After soaking at 1,273 K for about 6 hours, the ampoules are cold-water quenched and annealed at 973 K for 48 hours. The resulting ingots are pulverized and hot pressed at 700 K for 1 hour. In some embodiments, the compound is of a formula including $Na_xPb_{1-x}Te$, wherein $0.005 \leq x 0.02$. In some embodiments, the composition has a maximum thermoelectric figure of merit (zT) of greater than 1.0 at 750K. One of skill in the art would readily appreciate that other elements with similar characteristics could be substituted for those disclosed herein. One of skill in the art would likewise appreciate that alternative methods of making the compounds could be used. For example, the compounds could be heated at a temperature ranging from 600 to 1500 K for between 0.5 and 24 hours. Similarly, the annealing can be performed at a temperature ranging from 600 to 1200 K for between 1 and 120 hours. Finally, hot pressing can be alternatively performed at a temperature ranging from 700 to 1000 K for between 10 and 120 minutes.

In certain embodiments of the invention, one or more thermoelectric materials disclosed herein are used in a thermoelectric device. In some embodiments, a temperature gradient is applied to the thermoelectric device and electrical energy is collected. In some embodiments, electrical energy is applied to the thermoelectric material and heat is transferred from a first space at a first operation temperature to a second space at a second operation temperature, wherein the first operation temperature is lower than the second operation temperature.

Merely by way of example, thermoelectric modules including those made of materials disclosed herein are used to harness waste heat from automotive exhaust (500 K-800 K) to produce electricity and reduce $CO_2$ emissions.

One skilled in the art will recognize many methods and materials similar or equivalent to those described herein, which could be used in the practice of the present invention. Indeed, the present invention is in no way limited to the methods and materials described.

EXAMPLES

Example 1

Experiments I

Heavily Doped PbSe with High Thermoelectric Performance: an Alternative of PbTe

A recent calculation by Parker and Singh[12] suggests that heavily doped PbSe might reach zT~2 at temperature near 1000 K due to the appearance of a heavy band ~0.35 eV below the valence band edge, despite the small band gap. On the other hand there is the prevailing notion that PbSe has considerably lower performance compared to PbTe[13]. Also, the only high temperature (>450K) experimental data available on heavily doped PbSe implied peak zT ~0.7 instead of ~2 around 900 K.[14] The available data on high temperature thermoelectric properties are too limited to support either of these statements.

The inventors disclose herein the thermoelectric properties of a series of Na doped PbSe polycrystalline samples from room temperature to 850 K. Na is an excellent dopant in the sense of both providing high enough hole concentration and not interfering with PbSe valence bands. Samples of $Na_xPb_{1-x}Se$ with $0 \leq x \leq 0.025$ were prepared and identified according to the measured Hall carrier density ($n_H = 1/eR_H$) at room temperature (Table I). The range of samples studied spans carrier concentrations typical for good IV-VI thermoelectric materials.

TABLE 1

Sample list and some of their room temperature properties

| | | TE properties at 300 K | |
|---|---|---|---|
| Label | Formula | $n_H$ ($10^{20}$ cm$^{-3}$) | S (µV/K) |
| 1E18 | PbSe | 0.012 | 281 |
| 6E18 | $Na_{0.001}Pb_{0.999}Se$ | 0.059 | 146 |
| 1E19 | $Na_{0.0025}Pb_{0.9965}Se$ | 0.14 | 78 |
| 3E19 | $Na_{0.0035}Pb_{0.9965}Se$ | 0.31 | 68 |
| 6E19 | $Na_{0.006}Pb_{0.994}Se$ | 0.59 | 34 |
| 1E20 | $Na_{0.015}Pb_{0.985}Se$ | 1.2 | 23 |
| 2E20 | $Na_{0.0125}Pb_{0.9875}Se$ | 1.7 | 17 |
| 3E20 | $Na_{0.025}Pb_{0.975}Se$ | 2.6 | 10 |

Figure 1:
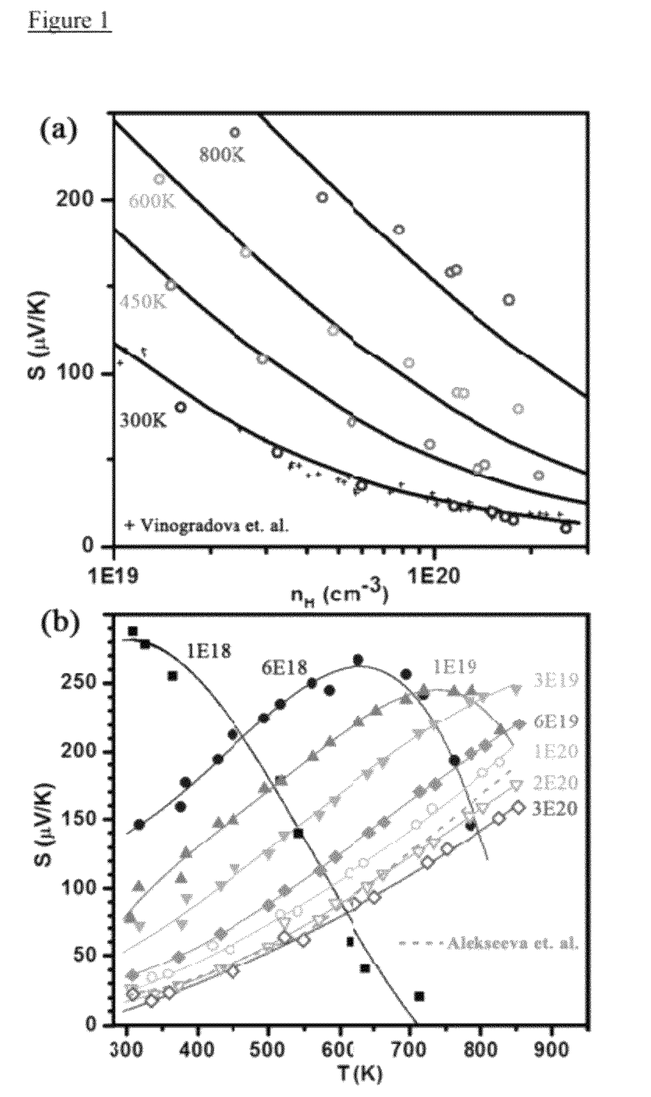
FIG. 1 demonstrates, in accordance with an embodiment of the invention, (a) Seebeck coefficients plotted against Hall carrier density for Na—PbSe system at different temperatures. Solid curves are based on SPB model with the effective mass m*=0.28 (300 K), 0.36 (450 K), 0.46 (600 K) and 0.71 (800K), respectively. (b) Temperature dependence of Seebeck coefficients.

The Seebeck coefficients show typical behavior of degenerate semiconductors and increase with temperature for all doped samples, being consistent with high temperature data reported by Alekseeva et. al.[14] (FIG. 1). In lightly doped ones, maximum are reached at high temperature due to the onset of thermal excitation of minority carriers (i.e., the bipolar effect). The reported experimental band gap $E_g$ of PbSe is fairly small at 0 K (0.14~0.17 eV) but with a temperature dependence[16] of $4 \times 10^{-4}$ eV K$^{-1}$, such a model gives $E_g$~0.44 eV at 700K. Whereas the effective $E_g$ obtained using $E_g = 2eT_{max}S_{max}$, where $S_{max}$, $T_{max}$ represents the maximum of Seebeck coefficient and the temperature at which this value is achieved,[17] yields 0.33 eV at 630 K ("6E18"), 0.37 eV at 740 K ("1E19") and >0.43 eV at 850 K ("3E19"), qualitatively being consistent with the model. On the other hand, in heavily doped samples, Seebeck coefficients increase monotonically up to 850 K without any sign of bipolar effect.

Values of S can be plotted against $n_H$ (the Pisarenko plot) at a constant temperature. FIG. 1(a) shows four Pisarenko plots at different temperatures. It is found at 300 K the experimental data fall satisfactorily on a curve based on the Single Parabolic Band (SPB) model[18] with m*=0.28 $m_e$ and assuming acoustic phonon scattering dominates. Results here agree well with available data reported by Vinogradova et. al. on Na—PbSe as shown in FIG. 1(a)[19].

As the temperature increases from 300 K to 450 K, the disagreement with the SPB model begins to appear for high $n_H$ samples. By 800 K the SPB model provides a qualitatively poor fit to the data. This suggests that the valence band structure is nearly parabolic at 300 K but becomes considerably non-parabolic at higher temperatures. This not only results in the deviation of data from the SPB model at high temperatures, but also enables the rapid increase of S with temperature[20] in heavily doped samples, which benefits thermoelectric performance.

Non parabolic behavior in PbSe can be described with different models. The non parabolic Kane model[21] has been used for PbSe[22] and other IV-VI compounds. However, for the Kane model to deviate from SPB more at high temperatures requires an effective mass changing with both temperature as well as carrier density.[16, 23]

Alternatively, non SPB features in PbSe can be modeled using multiple offset valence bands. A heavy hole band 0.35 eV below (at 0 K) the first light hole band edge has been proposed,[12, 23, 24] with the offset value decreasing with increasing temperature in some models. In this way, the heavy band will gradually contribute more to the carrier transport and increase Seebeck coefficients as the temperature is increased. This qualitatively explains the observed S at different temperatures.

Figure 2:
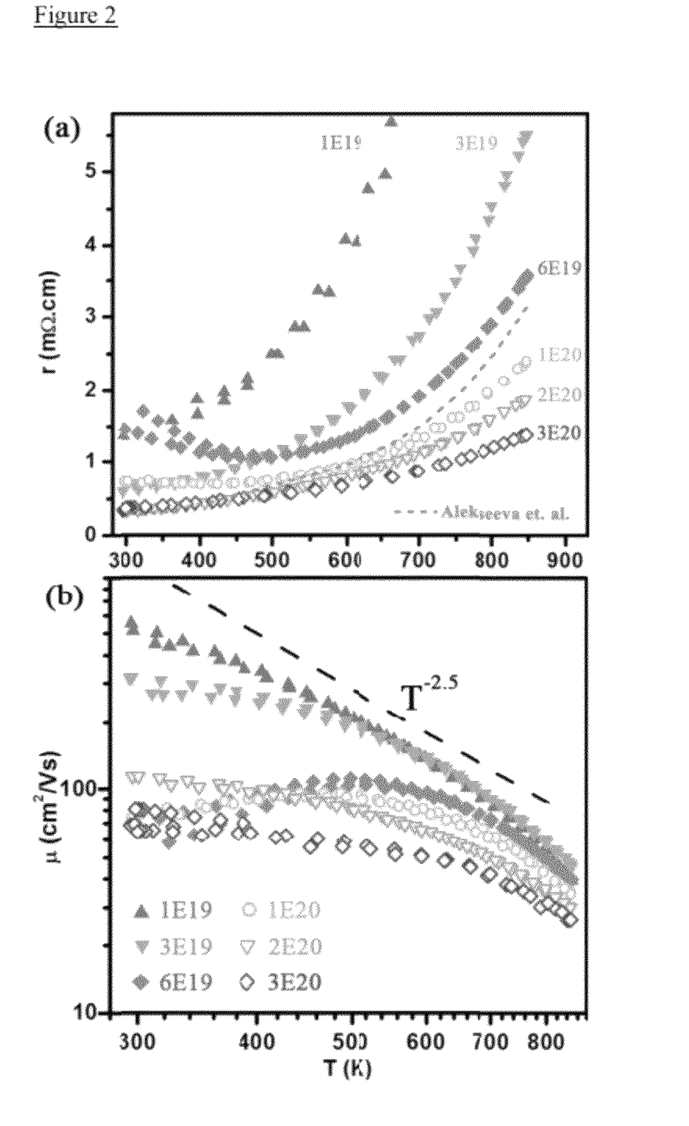
FIG. 2 demonstrates, in accordance with an embodiment of the invention, resistivity (a) and mobility (b) as functions of temperature for heavily doped PbSe samples.

The resistivities of all samples increase with temperature (FIG. 2(a)), due to the mobilities (μ) decreasing with temperature. Resistivity for the sample reported by Alekseeva et. al. roughly matches with heavily doped samples.

The exponent r in $\mu \sim T^r$ changes with doping levels from −2.5 ("1E19") to −1 ("2E20"), as can be seen in FIG. 2. Such behavior is common for heavily doped lead chalcogenides when acoustic phonon scattering dominates the carrier transport[25]. As the temperature further increases, a r<−2.5 is necessary to describe the μ(T) curve for all samples. While not wishing to be bound by any one particular theory, the temperature dependent mass and non SPB band structure may explain the μ(T) behavior in heavily doped samples[26], while for samples with lower doping levels, the impact of excitation of minority carriers must be taken into account. The samples '6E19' and '1E20' show unusually low mobility at 300 K that may be due to grain boundary effects or extrinsic impurities that only affect resistivity and mobility at low temperature. At high temperatures, the mobility and resistivity have a consistent trend as the other samples. Importantly, in their calculation Parker and Singh[12] assumed $\mu \sim T^l$ for heavily doped samples, which is verified here only for T<600 K; while, as admitted by the authors, zT at higher temperature would be overestimated, since the influence of the heavy band feature on mobility was not accounted for, but, as disclosed herein, it will take place at high temperatures.

Figure 3:
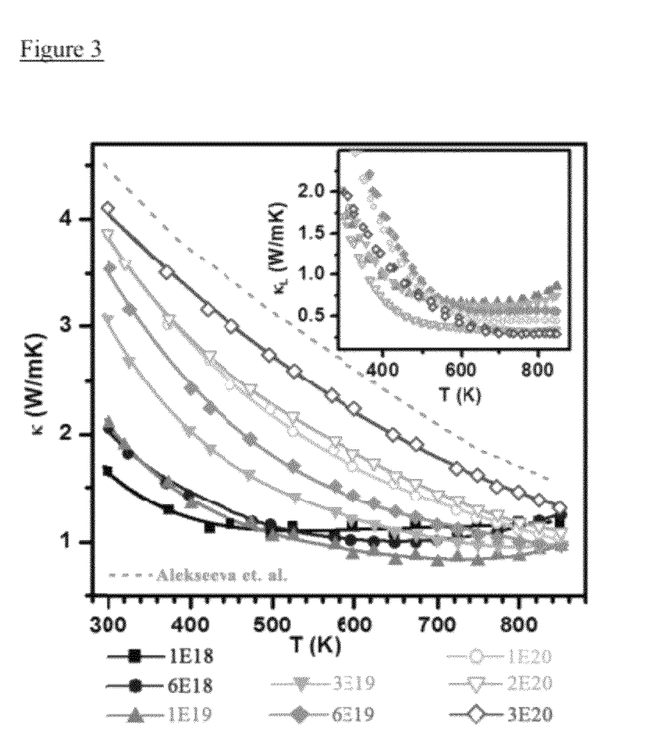
FIG. 3 demonstrates, in accordance with an embodiment of the invention, thermal conductivity and its lattice component (inset) as functions of temperature for different samples.

The thermal conductivities K measured up to 850 K are shown in FIG. 3. For most samples, κ decreases monotonically with temperature, except for lightly doped samples in which the bipolar effect leads to a noticeable increase at high temperature. The κ at 850 K increases with doping levels as expected from the increased electronic contribution. For samples with $n_H \sim 1 \times 10^{20}$ cm$^{-3}$ (300 K), this value is about 1 W m$^{-1}$ K$^{-1}$, which is very impressive given their high electric conductivity.

The sample from Alekseeva's work shows higher thermal conductivity throughout the temperature range. Compared with the inventors' heavily doped samples at 850K its κ is 50% higher, which is the primary reason for the low zT (~0.6 around 850K) found in this sample.

The lattice thermal conductivity is calculated by subtracting the electronic contribution using $\kappa_e = LT/\rho$ with the Lorenz number L calculated assuming acoustic phonon scattering and SPB model.

The calculated $\kappa_L$ of Na doped PbSe is 1.8±0.2 W m$^{-1}$ K$^{-1}$ at 300 K, consistent with available data.[12, 13] For the sample '1E18' (without Na doping) the measured K is 1.7 W m$^{-1}$ K$^{-1}$ at 300 K, which represents mostly the lattice contribution, since $\kappa_e$ is negligible (0.05 W m$^{-1}$ K$^{-1}$). '6E19' and '1E20' show unreasonably high $\kappa_L$ at room temperature, which can be explained by the abnormality in μ(T) near room temperature that voids the acoustic phonon scattering assumption and thus underestimates $\kappa_e$.

At high temperatures the $\kappa_L$(T) for heavily doped samples saturate (inset of FIG. 3) at a reasonably low 0.6 W m$^{-1}$ K$^{-1}$. While not wishing to be bound by any one particular theory, values lower than this in FIG. 3 could be due, in part, to the over-estimated Lorentz number from the single parabolic band assumption, and the Cp is likely underestimated.

It is very striking that PbSe has such low thermal conductivity (for PbTe $\kappa_L$=2 W m$^{-1}$ K$^{-1}$ at 300K), even though intuitively substituting heavy Te with the lighter element Se would give the opposite result. Nevertheless, the similar thermal conductivities of PbTe and PbSe can be explained from the following expression of lattice thermal conductivity above debye temperature and governed by Umklapp phonon scattering:[27]

$$\kappa_L = 8(k_B/h)^3 \frac{a^4 \rho \theta_D^3}{\gamma^2 T} \quad (1)$$

where $k_B$, h, α, ρ, $\theta_D$, and γ are the Boltzmann constant, Planck's constant, the lattice parameter, density, Debye temperature and the acoustic phonon Grüneisen parameter which is a measure of anharmonic nature of lattice vibration, respectively. Using published $\gamma^{28}$ (Table II) and $\theta_D$ based on the inventors' speed of sound measurement on polycrystalline samples, the ratio of lattice thermal conductivity in PbSe and PbTe, $\kappa_{L, PbSe}/\kappa_{L, PbTe}$ at 300 K is calculated to be 1.0, consistant with the experimental result. The reason $\kappa_L$ in PbSe is not higher than in PbTe is because the lattice parameter α of PbSe is smaller, and, more importantly, PbSe has a higher γ, i.e., a higher degree of anharmonicity in lattice vibration.

TABLE II

Materials parameters of PbSe and PbTe that influence lattice thermal conductivity.

| | PbSe | PbTe |
|---|---|---|
| ρ (g cm$^{-3}$) | 8.27 | 8.18 |
| $\theta_D$ (K) | 191 | 163 |
| a (Å) | 6.12 | 6.48 |
| γ | 2.23 | 1.96 |
| $v_l$ (m/s) | 3220 | 2900 |
| $v_t$ (m/s) | 1760 | 1600 |
| $v_{ave}$ (m/s) | 1960 | 1780 |

Figure 4:
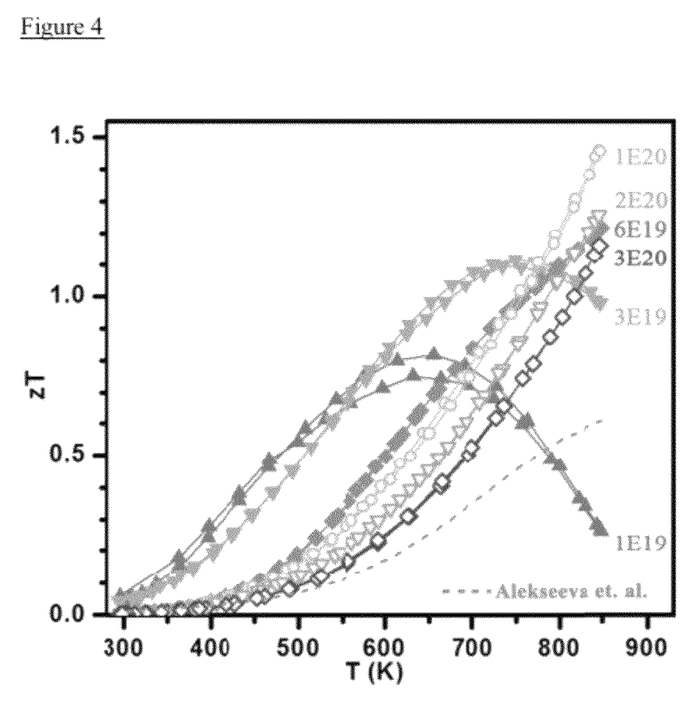
FIG. 4 demonstrates, in accordance with an embodiment of the invention, dimensionless figure of merit zT as functions of temperature for heavily doped samples.

The low thermal conductivities, together with the rapid increase of S in heavily doped samples, lead to promising thermoelectric performance. In a wide range of doping levels, from $3 \times 10^{19}$ cm$^{-3}$ to $3 \times 10^{20}$ cm$^{-3}$, zT greater than 1 were obtained when T>700 K (FIG. 4). A conservative estimation indicates peak zT>1.3 at 850 K with corresponding $n_H \sim 1.5 \times 10^{20}$ cm$^{-3}$ (300K).

In very heavily doped samples and high temperatures where these complex band features are seen, the zT continues to increase monotonically. Thus, it is likely that an even higher zT can be achieved at temperatures above 850 K.

High zT is achieved in PbSe because two essential conditions are met:

First, the Seebeck coefficients in heavily doped samples increase up to 850 K without indication of a peak caused by the bipolar effect. This is due to a high effective band gap ~0.4 eV at 850 K. Models of PbSe that include a strongly temperature dependent band gap also predict such a band gap at high temperatures. Alternatively, the Fermi level may be pinned 0.4 eV below the conduction band as suggested by Parker and Singh.[12]

Second, the thermal conductivity of PbSe is sufficiently low, particularly at high temperature, which is partly due to its large Grüneisen parameter, γ.

The exceptionally high zT in PbSe is likely enhanced by the non-single parabolic band effects apparent in the failure of the SPB model at high temperatures. It is important to point out that similar effects have also been observed in PbTe and $La_3Te_4$ with high zT due to close proximity of heavy and light bands.[13, 29, 30]

In Summary, polycrystalline PbSe doped with Na were prepared. Thermoelectric property measurements indicated that PbSe is a high zT material for mid-to-high temperature thermoelectric applications. At 850 K a peak zT>1.3 was observed when $n_H$~$1.5\times10^{20}$ $cm^{-3}$. The high zT originates from the large effective band gap at high temperature and low lattice thermal conductivity comparable to PbTe. In addition, significant non single parabolic band behavior is observed which may enhance the transport properties for thermoelectric applications. Results disclosed herein show that PbSe is a good thermoelectric material. Many strategies used to improve zT of PbTe, such as alloying with other elements, nanostructuring and band modification are also likely to provide plenty of room to further increase zT of PbSe. Importantly, PbSe offers a cheaper alternative to PbTe, as Se is more abundant and the cost is much less than that of Te. Moreover, the desirable band feature of PbSe implies that looking for systems with a strong non single parabolic band feature is likely to help identify more high performance thermoelectric materials.

Example 2

Experimental Procedures

All the samples were made via a conventional melting technique, where elements were loaded into sealed quartz ampoules and melted at 1400 K for 6 hours. After that the ampoules were quenched in water and annealed at 950 K for 60 hours. Ground powders were then loaded into graphite dies and hot pressed at 873 K (40 MPa) under argon for 30 minutes. Disk shaped samples are 12 mm in diameter, 1 mm in thickness, and with densities no less than 98% of theoretical values (8.27 g $cm^{-3}$).

Resistivity and Hall Measurements

Samples were loaded on a NB substrate with heaters. Four probes were attached to the edge of the sample. The sample was placed in a vacuum with a magnetic field perpendicular to its surface. The resistivity ρ and Hall coefficient $R_H$ (along the in-plane direction) were measured using the Van de Pauw method, and the Hall carrier density ($n_H=1/eR_H$) and mobility ($\mu=R_H/\rho$) were then calculated based on the measured result. The inventors estimate the uncertainty of results from this measurement to be 10%.

Seebeck Coefficient Measurements

Seebeck coefficients were obtained along the sample's cross-plane direction. The samples were placed into contact with two heaters on each surface in a vacuum chamber. Two Nb-Chromel thermocouples were also pressed against two surfaces of the sample by spring force. The heaters were programmed to provide a temperature difference oscillation between ±7° C. while maintaining a certain average temperature. The thermoelectric voltage as well as temperature on each surface was recorded using the thermocouples and the slope gives the Seebeck coefficient at this averaged temperature. The uncertainty of the S result is estimated to be (5%).

Thermal Conductivity Measurements

The laser flash method (Netzsch LFA457) was used. Samples coated with carbon were placed in a vacuum and one surface was shined with an intense laser pulse and the temperature response on the other surface was recorded versus time. Thermal diffusivity, α, was determined by analyzing the recorded curve. Density, ρ, was calculated using measured weights and dimensions. Heat capacity, $C_p$, was set as constant from Dulong-Petit Law, which states that above Debye temperature each mole of atom contributes 3R (R=8.314 J $K^{-1}$ $mol^{-1}$) to the total heat capacity. The thermal conductivity κ is calculated from $\kappa=\alpha\rho C_p$. The uncertainty of results is estimated to be 10%, combining those from measurement of α and ρ.

For all measurements, data were collected during both heating and cooling. Because the data were not necessarily recorded at the same temperature in different measurements, and also because little hysteresis was seen among heating and cooling results, curve fit is performed for Seebeck coefficient and thermal conductivity results and the fitted values together with measured resistivity were used to calculate zT. Thus, the hysteresis in zT(T) plot reflects that from the resistivity measurement. The uncertainty of zT values shown in the plot, which is the combination of uncertainties from each measurement, can be added to as much as 30%, while an estimate of 15% could be regarded as the average.

Example 3

Experiments II

High Thermoelectric Figure of Merit in Heavy-Hole Dominated PbTe

On 16-17 Jan. 1959 the headlines in Washington D.C. USA newspapers heralded the "world's first atomic battery" with a picture of President Eisenhower examining a Radioisotope Thermoelectric Generator (RTG) as it sat on his desk in the Oval Office of the White House[1, 2]. This 5 watt generator converted radioisotope heat to electricity using the Seebeck effect of Thermoelectric (TE) semiconductors made from n- and p-type PbTe. PbTe can be made p-type by replacing some divalent Pb with monovalent Na.[3] Doping of Na made the "2P-PbTe" used in this 1959 generator and for several NASA missions in the 1960's[1]

The thermoelectric properties of PbTe were extensively studied in both the USA (lead by the 3M corporation) and the Soviet Union for military and space applications in the 1950's and early 1960's[5-7]. As previously disclosed herein, the performance of a TE material is characterized by the TE figure of merit, $zT=S^2T/\rho(\kappa_E+\kappa_L)$, where S, ρ, $\kappa_E$ and $\kappa_L$ are the Seebeck coefficient, resistivity, and the electronic and lattice components of the thermal conductivity, respectively. At that time the Seebeck coefficient and resistivity could be measured accurately but thermal conductivity at high temperature was notoriously difficult to measure[8].

Not surprisingly then the 1960 report of Fritts, from 3M, does not use actual thermal conductivity data when showing a maximum zT of ~0.7. Instead, the room temperature lattice thermal conductivity was assumed at high temperatures[5, 6, 9], which underestimates zT. This relatively low maximum zT is similar with that for the "3P-PbTe"[10] used later by Teledyne for NASA[4]. The data of Fritts with the same maximum zT was therefore assumed to be accurate for PbTe:Na[5, 9, 11-13].

Not until the advent of the flash diffusivity technique, developed in the USA in the early 1960's, were high temperature thermal conductivity measurements of semiconductors reliable[8]. However, by then, The USA had switched from studying PbTe to Si—Ge alloys[14] due to the capability for higher temperature use. The Soviet groups leading efforts to understand the physics of PbTe[7] were not using the flash diffusivity method and report few high temperature measurements of $\kappa$[15-19]. It is perhaps not surprising then that until now, there has been no well documented report on the high temperature thermal conductivity of heavily doped PbTe:Na to show the maximum zT is actually ~1.5.

As previously disclosed herein, thermoelectrics are attracting renewed interest because of their ability to harvest electricity from waste heat[20]. Because the parameters S, $\rho$ and $\kappa_E$ are interdependent by the carrier concentration (n)[9, 21], the independent parameter, lattice thermal conductivity, can be reduced to increase zT. One proven route to minimize $\kappa_L$ and enhance zT to 1.4~1.7 at ~700 K in PbTe materials[22-24] has been the incorporation of nano-inclusions that act as phonon scattering centers.

Figure 5:
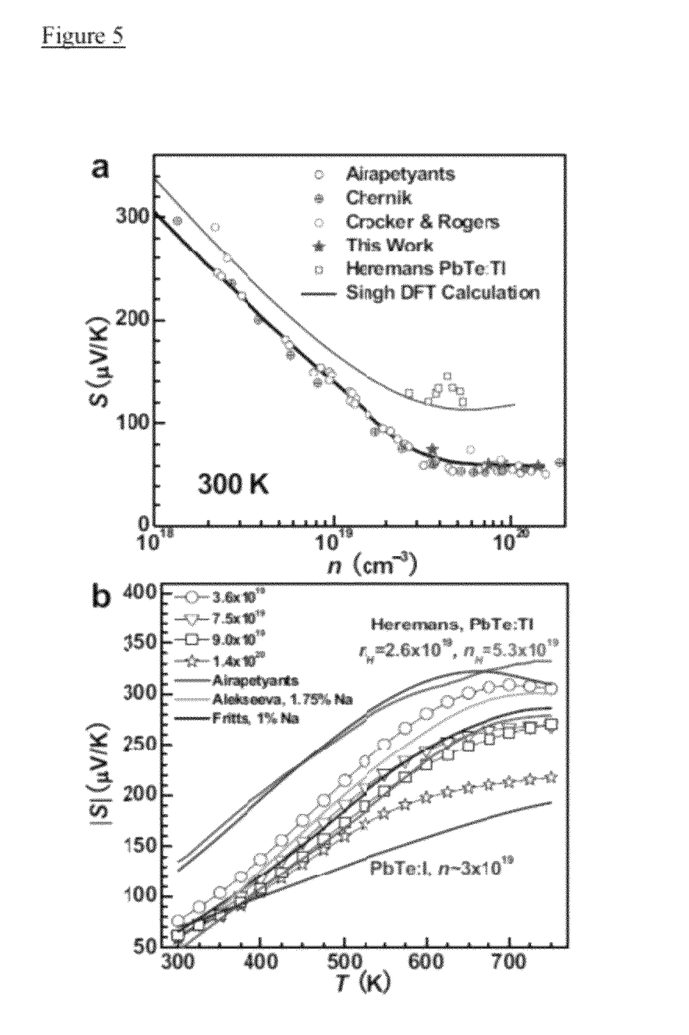
FIG. 5 demonstrates, in accordance with an embodiment of the invention, (a) room temperature Seebeck coefficient versus carrier concentration for p-type PbTe doped with Na[19, 29-31] and Tl[25]. The solid black line is the relationship shown by Airapetyants.[29] (b) Temperature dependent Seebeck coefficient for both p-[6, 19, 25, 29] and n-type[6] materials with high carrier concentrations.

Using a different mechanism, zT as high as ~1.5 has been achieved in p-type Tl-doped PbTe with hole concentrations close to $5 \times 10^{19}$ cm$^{-3}$. The high zT is attributed to the Tl-doping introducing a strong enhancement of the density-of-states (DOS) due to a resonant state near the Fermi level that results in a significant enhancement of the Seebeck coefficient[25]. The most direct evidence for the presence of the resonant state is the room temperature Seebeck coefficient of PbTe:Tl being significantly larger than that of normal PbTe materials with the same doping level (FIG. 5a).

However, a similar behavior of enhanced DOS around the Fermi level in heavily doped p-type PbTe without resonant states, has been found or proposed in both theoretical and experimental studies, due to either an additional band[7, 26, 27] or a complex Fermi surface[28] slightly below (~0.2 eV) the valence band edge. Therefore, the transport properties of PbTe at high doping levels (without resonant states) will be dominated by heavy mass holes, particularly at high temperatures due to the broadening of Fermi distribution. In the recent calculation by Singh[28], this DOS enhancement is enough to explain the high Seebeck coefficient of PbTe:Tl without including resonant states.

Experimentally, Na will dope PbTe with hole concentrations ranging from ~$10^{18}$ to ~$10^{20}$ cm$^{-3}$[7, 29-32] and does not introduce resonant states[26, 33]. The S of PbTe:Na decreases with hole concentration according to the Pisarenko relation expected for a single parabolic band at low hole concentrations[29]. The dependence of S on n at high carrier concentrations shows a deviation[7, 29-32] from the trend expected from the Pisarenko relationship, leading to an increased Seebeck coefficient (FIG. 5a).

Here the inventors confirm the previous results on S, $\rho$, n for heavily doped PbTe:Na and measure the high temperature thermal conductivity, resulting in a zT reaching ~1.5 in heavily doped samples at ~750 K. The inventors demonstrate herein, both the heavy hole character in PbTe:Na as well as the enhanced S in PbTe:Tl due to resonant states.

Polycrystalline Na$_x$Pb$_{1-x}$Te ($0.005 \le x \le 0.02$) samples were synthesized by melting, annealing and hot-pressing. Stoichiometric mixtures of high purity Na (99%), Pb (99.999%) and Te (99.9999%) ingots were sealed in graphite coated ampoules under vacuum and heated to 1273 K at ~500 K/hour. After soaking at 1273 K for about 6 hours, the ampoules were cold-water quenched and annealed at 973 K for 48 hours. The resulting ingots were pulverized and hot pressed at 700 K for 1 hour. Pellets with a relative density of 98% or higher were used for measurements of transport properties. The Seebeck coefficient was obtained from the slope of the thermopower vs. temperature gradients using Chromel-Nb thermocouples. The resistivity and Hall coefficient (R$_H$) were simultaneously measured using the Van der Pauw technique under a reversible magnetic field of 2T. Thermal diffusivity was measured by the laser flash method (Netzsch LFA 457). All of the measurements were carried out under vacuum in the temperature range of 300-750 K. Consistent measurements, within ~10% for Seebeck and Resistivity were confirmed at JPL (using W-Nb thermocouples) and ULVAC-ZEM3 at ZTPlus on a sample with zT ~1.4 at 700K. Scanning Seebeck coefficient measurements (at 300K) on the sample with Hall carrier density of $9 \times 10^{19}$ cm$^{-3}$ showed a Seebeck coefficient variation of only 5 $\mu$V/K (full width for 90% of the data). The Dulong-Petit heat capacity (C$_p$=0.15 J/g-K, close to the experimental results from 150 to 270 K[34]) was used for the estimation of thermal conductivity. The combined uncertainty for the determination of zT is ~20%.

X-ray diffraction and scanning electron microscope analysis was used to confirm that the materials for this study were single phased. The obtained samples have room temperature Hall carrier densities (n$_H$) of 3.5, 7.5, 9.0 and $14 \times 10^{19}$ cm$^{-3}$, estimated by n$_H$=1/eR$_H$. FIG. 5 (a) shows the Hall carrier density dependent Seebeck coefficient at room temperature.

The samples made for this study are consistent with the previous studies on PbTe:Na single crystals[29, 30] showing the same in S vs. n behavior at room temperature (FIG. 5a), including the deviation which results in a flattening of the curve at S ~60 $\mu$V/K.

It has been asserted that this deviation in Seebeck coefficient, as well as other electronic transport property behavior, could be explained by a two-band model (light and heavy bands).[7, 29-32, 35-37] much like that found the La$_{3-x}$Te$_4$ system[38]. At low hole concentrations the light band dominates the Seebeck coefficient and other transport properties, while at high hole concentrations the heavy band contribution enhances the Seebeck coefficient beyond the value predicted by the Pisarenko relationship for the light band[7, 29]. The band offset (difference in energy between the band maxima of light and heavy bands) has been reported to be temperature dependent, such that the light band goes below the heavy band at approximately 400 K[7, 39]. A modeling study, based on multi-parabolic bands and the above described band structure features, predicted an optimized zT as high as ~1.7 in heavily doped (~$10^{20}$ cm$^{-3}$) p-PbTe at ~750K, which is about twice of that in n-PbTe[35], due to the heavy mass carriers behavior.

FIG. 5a also shows the Seebeck coefficient predicted from DFT calculations[28] of p-PbTe (blue solid line). The calculation shows a similar flattening due to a complex Fermi surface, where the Seebeck coefficient becomes approximately constant at S ~120 $\mu$V/K when the carrier density is greater than ~$4 \times 10^{19}$ cm$^{-3}$. The difference between the calculated and experimental Seebeck coefficient may originate from the uncertainties of band structure and/or the associated temperature dependence. It should also be noted that the experimental carrier density is Hall density ($n_H$), while the DFT carrier density is a doping density, n. It is believed that $n_H$ is much smaller than n when the mobility ratio of heavy holes to light holes is small[7, 40]. In one report, spectroscopic analysis suggested an actual hole density (n) of ~15×10$^{19}$ cm$^{-3}$ while Hall measurement showed a hole density ($n_H$) of only ~9×10$^{19}$ cm$^{-3}$[29].

The analysis using two-band model and both DFT calculations[27, 28] discussed above, indicate the presence of enhance DOS closed to valence band edge, which predicts the flatting of S (FIG. 5a). Thus the observed flattening of the Seebeck coefficient can be explained by either the complex Fermi surface found by Singh, or an offset heavy band model.

In contrast, n-type PbTe[26, 28] lacks a DOS enhancement around the Fermi level and shows a more typical Seebeck coefficient proportional to absolute temperature. With increasing temperature, the pronounced enhancement of the Seebeck coefficient in p-type materials indicates an increasing number of heavy mass holes contribute to the transport properties, due to a broader Fermi distribution at high temperatures. Below 400K, p- and n-type PbTe have similar S due to similar effective masses[7] (0.36$m_e$ for light hole and 0.3$m_e$ for electron). However, a significant discrepancy starts at ~400 K with p-type material showing an atypical increase in slope of S vs. T resulting in a larger Seebeck coefficient at temperatures higher than 400K. This observation is consistent with the two band model in which the band offset between light and heavy bands becomes smaller with temperature and vanishing at ~400 K[7, 39, 41].

The PbTe:Tl[25] system shows an even higher S than the various PbTe:Na samples, indicating that there is an enhancement effect present due to the resonant states. Although it is concluded that the resonant states by Tl-doping are responsible for the enhancement of the Seebeck coefficient[25] at room temperature, the heavy mass behavior is likely to be additionally contributing to the Seebeck coefficient in PbTe:Tl at higher temperatures.

Figure 6:
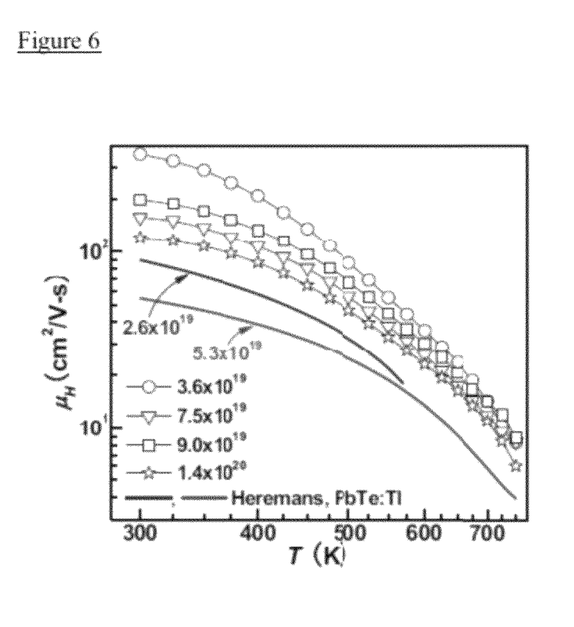
FIG. 6 demonstrates, in accordance with an embodiment of the invention, Hall mobility versus temperature for PbTe:Na and the comparison with that of PbTe:Tl[25].

Additionally, the carrier mobility in PbTe:Tl has been found to be decreased by a significant factor[25]. Both PbTe:Tl and PbTe:Na have a similar temperature dependence of Hall mobility as shown in FIG. 6, however the mobility of PbTe:Na are approximately twice that of PbTe:Tl over the whole temperature range. The resonant impurity states in the Tl-doped material should lead to a reduced group velocity and therefore reduce carrier mobility.

Figure 7:
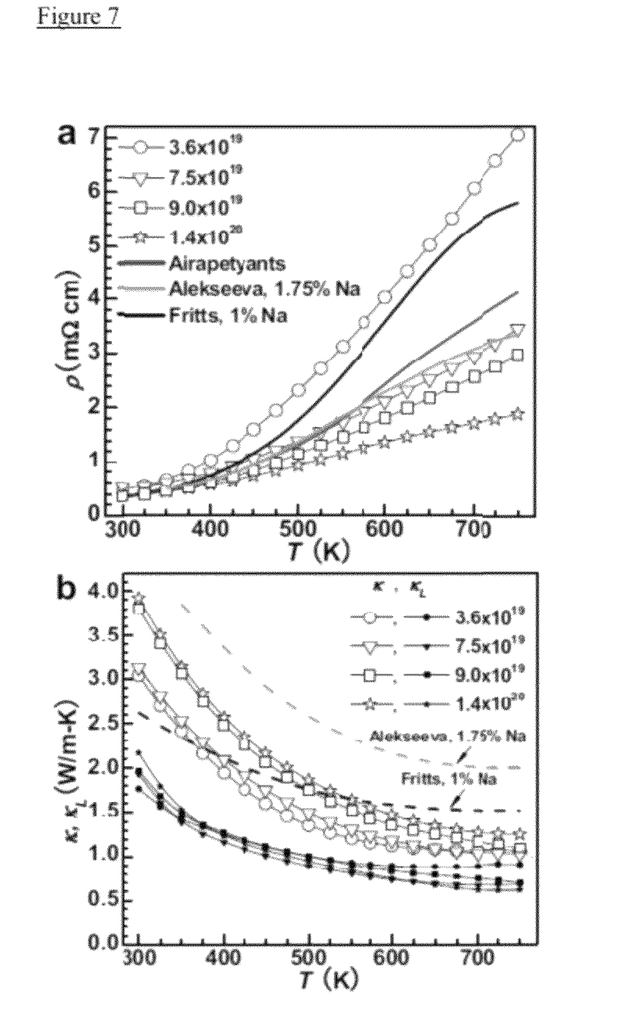
FIG. 7 demonstrates, in accordance with an embodiment of the invention, temperature dependent electrical resistivity (a), thermal conductivity and the lattice component of thermal conductivity (b) for PbTe:Na. Data plotted as lines are from the literature[6, 19, 29].

The total thermal conductivity ($\kappa$)[42] of the PbTe:Na samples are shown in FIG. 7b as open symbols. Since Na acts as an effective acceptor, the increased hole concentration (FIG. 5a) results in a decreased resistivity as shown in FIG. 7a. As a result of the decreased resistivity, the electronic contribution to the thermal conductivity, as determined by Wiedemann-Franz Law ($\kappa_E = LT/\rho$), is increased resulting in larger total thermal conductivity as shown in FIG. 7b.

Due to the complexity and the non-parabolicity of the valence band structure around the Fermi level, accurate determination of the Lorenz number (L) is difficult. An estimation of L can be made using a single parabolic band (SPB) model with acoustic scattering[43] resulting in an L with a deviation of less than 10%[23] as compared with a more rigorous non-parabolic band model calculation[44]. The estimation of the lattice thermal conductivity (FIG. 7b, solid symbols) is made by subtracting the electronic component from the total thermal conductivity, $\kappa_L = \kappa - \kappa_L$. The estimated lattice thermal conductivity for both PbTe:Na and PbTe:Tl is approximately 2 W/m-K at room temperature and ~0.7 W/m-K at ~750 K, these values are also consistent with n-type PbTe materials, within the uncertainty range of L-estimation[7, 45]. The slightly higher $\kappa_L$ for the lowest carrier density sample at T>~550 K is probably due to the bipolar contribution. In the previously reported study of Fritts[6], the temperature independent lattice thermal conductivity of ~1.5 W/m-K and non-degenerate L was used and resulted in an overestimation of the total thermal conductivity for 1% Na-doped PbTe at high temperatures, shown in FIG. 7b as a dashed black line.

Figure 8:
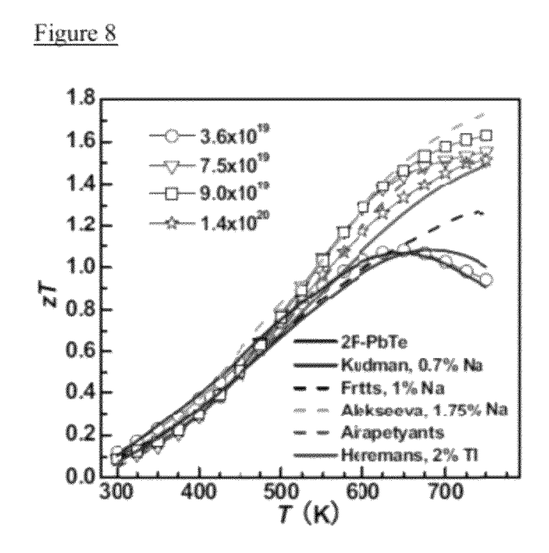
FIG. 8 demonstrates, in accordance with an embodiment of the invention, temperature dependent thermoelectric figure of merit for PbTe:Na, measured in this work (symbols), reported in the literature[46, 47] (solid lines) and that estimated from electronic transport data in the literature (dashed lines)[6, 19, 29], as well as PbTe:Tl[25]. The reported 2P-PbTe is consistent with the under doped PbTe:Na.

Using the estimated lattice thermal conductivity for PbTe:Na, the figure of merit for 1% Na-doped PbTe reported by Fritts was recalculated (FIG. 8). The resulting maximum zT of ~1.3 is nearly twice the original value that used the room temperature lattice thermal conductivity for high temperatures[5, 6, 9]. Using the same estimate for temperature dependent lattice thermal conductivity in combination with previously reported[19, 29] S and $\rho$ for heavily doped PbTe:Na, reveals an even higher zT.

Not only the zT of 2P-PbTe reported by Skrabeck[46] but also of the 0.7% Na-doped PbTe reported by Kudman,[47] are in excellent agreement with the sample here (0.5% Na-doping) with $n_H$ of 3.6×10$^{19}$ cm$^{-3}$, suggesting the 2P-PbTe and 0.7% Na-doped sample[47] are slightly under doped. An increase in hole density by increasing doping content of Na to 1~2%, results in a further enhancement of zT to ~1.5, primarily due to the suppression of minority carrier activation at high temperature.

Due to the heavy hole dominated transport properties at high doping levels and high temperatures, these PbTe:Na materials with high Na content show comparable zT with the resonant PbTe:Tl[25] system—despite the further enhancement of S due to the Tl-resonant states (FIG. 5). The increased Seebeck coefficient by resonant states at the expense of carrier mobility appears to be responsible for the similar zT. Samples with $n_H$>~7.5×10$^{19}$ cm$^{-3}$, have been made reproducibly in the inventors' experiments showing zT>1.4 at ~750K, making PbTe:Na a promising and Tl-free material for high performance thermoelectric power generation applications.

In summary, p-type PbTe materials with high doping levels of Na were prepared and the electrical properties are consistent with previously reported results. Both the experimental results and the theoretical calculations suggest that the electronic transport properties of these samples are heavily influenced by a high DOS near the Fermi level leading to holes with heavy effective mass. These heavy mass carriers lead to a large Seebeck coefficient (compared to n-type PbTe) and high thermoelectric figure of merit of ~1.5 at ~750 K. The high zT observed is intrinsic to PbTe and may contribute to the high zT observed in related p-type PbTe-based systems such as PbTe:Tl[25] and nanostructured materials[22].

The presence of a sharp increase on density of states near the Fermi Level is a beneficial characteristic in some high zT materials. As this is a purely electronic effect, reductions in the lattice thermal conductivity, through nanostructuring for example, should lead to further improvements in zT.

Example 4

PbSe System

Additional Experiments

Similar to Tl—PbTe, Tl has been confirmed to form a resonant level also in PbSe, about 0.22-0.26 eV below valence band edge (300K). This makes it possible to take advantage of resonant scattering to improve TE performance of PbSe. But, instead of using Tl as dopant solely, additional doping of Na is necessary to tune the impurity band filling parameter to the optimized values to truly reveal the resonant scattering effect. Experimentally, this can be done in four different Tl compositions: 0.5% Tl, x % Na—PbSe (x=0, 0.25, 0.5, 0.75, 1), 1% Tl, x % Na—PbSe (x=0, 0.5, 1, 1.5, 2), 1.5% Tl, x % Na—PbSe (x=0, 0.75, 1.5, 2, 2.5), 2% Tl, x % Na—PbSe (x=0, 1, 1.5, 2, 2.5). There is no explicit data on how the resonant scattering influences TE properties when T is above, about 450K. So, together with Na—PbSe this work will further advance the understanding of both PbSe and the influence of resonant scattering on TE properties.

While not wishing to be bound by any one particular theory, it appears PbSe resembles PbTe in the sense of the light band/heavy band structure in their valence band. The difference is 1) the effective mass of the light band is smaller in the PbSe case (0.28 vs 0.35) the effective mass of the heavy band should also be different but there is no conclusion as to whether it is smaller or larger. 2) the gap between the light band and the heavy band is larger. This feature determines PbSe shows peak zT at a higher temperature than PbTe (and also that at low temperature zT would be lower). While not wishing to be bound by any one particular theory, because PbTe and PbSe form a complete solid solution, there is a good possibility that by changing the composition $PbTe_xSe_{1-x}$, the zT curve can be tuned, so that peak zT can be achieved at different temperatures. This would be particularly useful when making graded TE devices.

Another candidate likely to be useful is Sn. Because alloying with Sn greatly changes the band structure of PbTe (the energy level crossover), it seems likely that Sn will have a similar effect on PbSe. This is likely to be useful, because: 1) the peak zT temperature would likely be controllable; 2) the position of impurity states (Tl) might be controlled by the composition of $Pb_{1-x}Sn_xSe$; this then might affect the temperature at which the resonant scattering is most effective; 3) there is evidence Sn defect centers have similar features as Tl; and 4) it is likely Sn can increase mechanical behavior/decrease thermal conductivity.

Further, Cd and Mn are likely useful to enhance TE performance in PbSe. Also, while not wishing to be bound by any one particular theory, it seems likely that doping PbSe with Cr will result in an impurity band in the conduction band, which is located at 0.125 eV ($5k_BT$ at 300K, compared to a Tl state of 0.22 eV below the band edge in PbTe and PbSe) above the conduction band bottom.

Finally, MA synthesis of PbSe has never been reported, while based on knowledge of PbTe this is likely worthwhile, especially because it is a popular belief that MA is a simpler and more efficient way for TE materials fabrication. While it is hard to find a proper dopant for MA that provides high enough carrier density, it seems likely that Tl might be a candidate. It also seems likely that La might give good n type results.

The various methods and techniques described above provide a number of ways to carry out the application. Of course, it is to be understood that not necessarily all objectives or advantages described can be achieved in accordance with any particular embodiment described herein. Thus, for example, those skilled in the art will recognize that the methods can be performed in a manner that achieves or optimizes one advantage or group of advantages as taught herein without necessarily achieving other objectives or advantages as taught or suggested herein. A variety of alternatives are mentioned herein. It is to be understood that some preferred embodiments specifically include one, another, or several features, while others specifically exclude one, another, or several features, while still others mitigate a particular feature by inclusion of one, another, or several advantageous features.

Furthermore, the skilled artisan will recognize the applicability of various features from different embodiments. Similarly, the various elements, features and steps discussed above, as well as other known equivalents for each such element, feature or step, can be employed in various combinations by one of ordinary skill in this art to perform methods in accordance with the principles described herein. Among the various elements, features, and steps some will be specifically included and others specifically excluded in diverse embodiments.

Although the application has been disclosed in the context of certain embodiments and examples, it will be understood by those skilled in the art that the embodiments of the application extend beyond the specifically disclosed embodiments to other alternative embodiments and/or uses and modifications and equivalents thereof.

In some embodiments, the terms "a" and "an" and "the" and similar references used in the context of describing a particular embodiment of the application (especially in the context of certain of the following claims) can be construed to cover both the singular and the plural. The recitation of ranges of values herein is merely intended to serve as a shorthand method of referring individually to each separate value falling within the range. Unless otherwise indicated herein, each individual value is incorporated into the specification as if it were individually recited herein. All methods described herein can be performed in any suitable order unless otherwise indicated herein or otherwise clearly contradicted by context. The use of any and all examples, or exemplary language (for example, "such as") provided with respect to certain embodiments herein is intended merely to better illuminate the application and does not pose a limitation on the scope of the application otherwise claimed. No language in the specification should be construed as indicating any non-claimed element essential to the practice of the application.

Preferred embodiments of this application are described herein, including the best mode known to the inventors for carrying out the application. Variations on those preferred embodiments will become apparent to those of ordinary skill in the art upon reading the foregoing description. It is contemplated that skilled artisans can employ such variations as appropriate, and the application can be practiced otherwise than specifically described herein. Accordingly, many embodiments of this application include all modifications and equivalents of the subject matter recited in the claims appended hereto as permitted by applicable law. Moreover, any combination of the above-described elements in all possible variations thereof is encompassed by the application unless otherwise indicated herein or otherwise clearly contradicted by context.

All patents, patent applications, publications of patent applications, and other material, such as articles, books, specifications, publications, documents, things, and/or the like, referenced herein are hereby incorporated herein by this reference in their entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that can be employed can be within the scope of the application. Thus, by way of example, but not of limitation, alternative configurations of the embodiments of the application can be utilized in accordance with the teachings herein. Accordingly, embodiments of the present application are not limited to that precisely as shown and described.

REFERENCES

Experiments I

1. D. T. Crane and J. W. Lagrandeur, J. Electron. Mater. 39 (9), 2142-2148 (2010).
2. G. J. Snyder and E. S. Toberer, Nat. Mater. 7 (2), 105-114 (2008).
3. C. Wood, Rep. Prog. Phys. 51 (4), 459-539 (1988).
4. F. D. Rosi, E. F. Hockings and N. E. Lindenblad, Rca Review 22 (1), 82-121 (1961).
5. A. J. Minnich, M. S. Dresselhaus, Z. F. Ren and G. Chen, Energy Environ. Sci. 2 (5), 466-479 (2009).
6. V. I. Kaidanov, S. A. Nemov and Y. I. Ravich, Soviet Physics Semiconductors—Ussr 26 (2), 113-125 (1992).
7. K. F. Hsu, S. Loo, F. Guo, W. Chen, J. S. Dyck, C. Uher, T. Hogan, E. K. Polychroniadis and M. G. Kanatzidis, Science 303 (5659), 818-821 (2004).
8. J. Q. He, S, N. Girard, M. G. Kanatzidis and V. P. Dravid, Adv. Funct. Mater. 20 (5), 764-772 (2010).
9. J. P. Heremans, V. Jovovic, E. S. Toberer, A. Saramat, K. Kurosaki, A. Charoenphakdee, S. Yamanaka and G. J. Snyder, Science 321 (5888), 554-557 (2008).
10. J. Androulakis, K. F. Hsu, R. Pcionek, H. Kong, C. Uher, J. J. Dangelo, A. Downey, T. Hogan and M. G. Kanatzidis, Adv. Mater. 18 (9), 1170-1173 (2006).
11. R. R. Heikes and R. W. Ure, Thermoelectricity: Science and Engineering. (Interscience Publishers, Inc., New York, 1961).
12. D. Parker and D. J. Singh, Phys. Rev. B 82 (3), 035204 (2010).
13. Y. I. Ravich, B. A. Efimova and I. A. Smirnov, Semiconducting lead chalcogenides. (Plenum Press, New York, 1970).
14. G. T. Alekseeva, E. A. Gurieva, P. P. Konstantinov, L. V. Prokofeva and M. I. Fedorov, Semiconductors 30 (12), 1125-1127 (1996).
15. A. N. Veis, V. I. Kaidanov, R. F. Kuteinikov, S. A. Nemov, S. A. Rudenko and Y. I. Ukhanov, Soviet Physics Semiconductors—Ussr 12 (2), 161-163 (1978).
16.1. A. Smirnov, B. Y. Moizhes and E. D. Nensberg, Soviet Physics-Solid State 2 (8), 1793-1804 (1961).
17. H. J. Goldsmid and J. W. Sharp, J. Electron. Mater. 28 (7), 869-872 (1999).
18. A. F. May, E. S. Toberer, A. Saramat and G. J. Snyder, Phys. Rev. B 80 (12), 125205 (2009).
19. M. N. Vinogradova, I. M. Rudnik, L. M. Sysoeva and N. V. Kolomoet, Soviet Physics Semiconductors—Ussr 2 (7), 892-893 (1969).
20. L. M. Sysoeva, M. N. Vinograd, N. V. Kolomoet and Y. I. Ravich, Soviet Physics Semiconductors—Ussr 3 (8), 975-977 (1970).
21. S. Ahmad and S. D. Mahanti, Phys. Rev. B 81 (16), 165203 (2010).
22. S. A. Nemov, F. S, Nasredinov, P. P. Seregin, N. P. Seregin and E. S. Khuzhakulov, Semiconductors 39 (6), 638-641 (2005).
23. A. N. Veis, R. F. Kuteinikov, S. A. Kumzerov and Y. I. Ukhanov, Soviet Physics Semiconductors—Ussr 10 (11), 1320-1321 (1976).
24. M. N. Vinogradova, N. V. Kolomoet, I. M. Rudnik and L. M. Sysoeva, Soviet Physics Semiconductors—Ussr 3 (2), 231-& (1969).
25. Schlicht. U and K. H. Gobrecht, J. Phys. Chem. Solids 34 (4), 753-758 (1973).
26. A. V. Brodovoi, G. V. Lashkarev, M. V. Radchenko and K. D. Tovstyuk, Soviet Physics Semiconductors—Ussr 18 (4), 380-382 (1984).
27. H. J. Goldsmid, The Thermal Properties of Solids. (Dover Publications, Inc., New York, 1965).
28. Y. Zhang, X. Z. Ke, C. F. Chen, J. Yang and P. R. C. Kent, Phys. Rev. B 80 (2) (2009).
29. A. A. Andreev and V. N. Radionov, Soviet Physics Semiconductors—Ussr 1 (2), 145-148 (1967).
30. A. F. May, D. J. Singh and G. J. Snyder, Phys. Rev. B 79 (15) (2009).

REFERENCES

Experiments II

[1] Atomic Power in Space, a History. US DoE March 1987, http://www.fas.org/nuke/space/index.html
[2] E. Gamarekian, First Atom Battery Developed by U.S. Washington Post 17 Jan. 1959 page A1,
[3] E. S. Toberer, A. F. May and G. J. Snyder, Chem. Mater., 22, 624, (2010).
[4] R. D. Abelson, In Thermoelectrics handbook: macro to nano, Ed. by Rowe D M; CRC/Taylor & Francis: Boca Raton, 2006; p 566~567
[5] R. R. Heikes, R. C. Miller and R. W. Ure, In Thermoelectricity: science and engineering, Ed. by Heikes R R and Ure R W; Interscience Publishers: New York, 1961; p 407~413
[6] R. W. Fritts, In Thermoelectric Materials and Devices, Ed. By Cadoff I B and Miller E; Reinhold Publishing Corporation: New York: Reinhold, 1960; p 143~162
[7] Y. I. Ravich, B. A. Efimova and I. A. Smirnov, Semiconducting Lead Chalcogenides. Plenum, N.Y., 1970.
[8] W. J. Parker, R. J. Jenkins, C. P. Butler and G. L. Abbott, J. Appl. Phys., 32, 1679, (1961).
[9] G. J. Snyder and E. S. Toberer, Nature Materials, 7, 105, (2008).
[10] It was known but not well publicized that 3P-PbTe, which also contained Sn and Mn, had lower zT than 2P-PbTe but nevertheless was used because of better mechanical properties and ease of bonding[46].
[11] C. Wood, Rep. Prog. Phys., 51, 459539, (1988).
[12] G. J. Snyder, In Thermoelectrics handbook: macro to nano, Ed. by Rowe D M; CRC/Taylor & Francis: Boca Raton, 2006; p 91~926
[13] V. Fano, In CRC Handbook of Thermoelectrics, Ed. by Rowe D M; CRC Press: Boca Raton, Fla., 1995; p p 261
[14] C. B. Vining, In CRC Handbook of Thermoelectrics, Ed. by Rowe D M; CRC Press: Boca Raton, Fla., 1995; p 329~337
[15] A. V. Petrov, In Thermoelectric Properties of Semiconductors, Ed. by Kutasov V A; Consultants Bureau New York, 1964; p 17
[16] B. A. Efimova, L. A. Kolomoets, Y. I. Ravich and T. S. Stavitskaya, Soviet Phys. Semiconductors, 4, 1653, (1971).
[17] G. T. Alekseeva, V. K. Zaitsev, A. V. Petrov, V. I. Tarasov and M. I. Fedorov, Sov. Phys. Solid State, 23, 1685, (1981).

[18] E. D. Devyatkova and V. A. Saakyan, *Izv. Akad. Nauk Arm. SSR, Ser. Fiz. [in Russian]*, 2, 14, (1967).
[19] G. T. Alekseeva, E. A. Gurieva, P. P. konstantinov and L. V. P. I. fedorov, *Semiconductors*, 30, 1125, (1996).
[20] L. E. Bell, *Science*, 321, 1457, (2008).
[21] A. F. Ioffe, *Semiconductor thermoelements, and Thermoelectric cooling*. Infosearch, ltd., London, 1957.
[22] M. G. Kanatzidis, *Chem. Mater.*, 22, 648, (2010).
[23] Y. Pei, J. Lensch-falk, E. S. Toberer, D. L. Medlin and G. J. Snyder, *Adv. Func. Mat.*, Accepted for publication, (2010).
[24] K. F. Hsu, S. Loo, F. Guo, W. Chen, J. S. Dyck, C. Uher, T. Hogan, E. K. Polychroniadis and M. G. Kanatzidis, *Science*, 303, 818, (2004).
[25] J. P. Heremans, V. Jovovic, E. S. Toberer, A. Saramat, K. Kurosaki, A. Charoenphakdee, S. Yamanaka and G. J. Snyder, *Science*, 321, 554, (2008).
[26] K. Hoang, S. D. Mahanti and M. G. Kanatzidis, *Phys. Rev. B*, 81, 115106, (2010).
[27] D. Bilc, S. D. Mahanti, E. Quarez, K. Hsu, R. Pcionek and M. G. 24 Kanatzidis, *Phys. Rev. Lett.*, 93, 146403, (2004).
[28] D. J. Singh, *Phys. Rev. B*, 81, 195217, (2010).
[29] S. V. Airapetyants, M. N. Vinogradova, I. N. Dubrovskaya, N. V. Kolomoets and I. M. Rudnik, *Soviet Phys. Solid State*, 8, 1069, (1966).
[30] I. A. Chernik, V. I. Kaidanov, M. I. Vinogradova and N. V. Kolomoets, *Soviet Phys. Solid State*, 2, 645, (1968).
[31] A. J. Crocker and L. M. Rogers, *Br. J. Appl. Phys.*, 18, 563, (1967).
[32] A. J. Crocker and L. M. Rogers, *J. De Physique*, C4, 129, (1968).
[33] S. Ahmad, S. D. Mahanti, K. Hoang and M. G. Kanatzidis, *Phys. 36 Rev. B*, 74, 155205, (2006).
[34] D. H. Parkinson and J. E. Quarrington, *Proc. Phys. Soc.*, LXVII, 41, (1954).
[35] L. M. Syoeva, M. N. Vinogradova, N. V. Kolomoets and Y. I. 40 Ravich, *Soviet Phys. Solid State*, 3, 975, (1970).
[36] R. S. Allgaier, *J. Appl. Phys.*, 32, 2185, (1961).
[37] R. S. Allgaier and B. B. Houston, *J. Appl. Phys.*, 37, 302, (1966).
[38] A. F. May, D. J. Singh and G. J. Snyder, *Phys. Rev. B*, 79, 153101, (2009).
[39] Y. W. Tsang and M. L. Cohen, *Phys. Rev. B*, 3, 1254-1261, (1971).
[40] E. H. Putley, *The Hall Effect and Related Phenomena*. Butterworths, London, 1960.
[41] A. A. Andreev and V. N. Radionov, *Soviet Phys. Semiconductors*, 1, 145, (1967).
[42] The constant Dulong-Petit heat capacity used for determining the thermal conductivity, is likely underestimated by about 10% at ~700 K [48]. Thus the actual thermal conductivity at high temperatures could be about 10% higher and zT 10% lower than the result shown here.
[43] C. M. Bhandari and D. M. Rowe. In *CRC Handbook of Thermoelectrics*, Ed. by Rowe D M; CRC Press: Boca Raton, Fla., 1995; p 45.
[44] S. Ahmad and S. D. Mahanti, *Phys. Rev. B*, 81, 165203, (2010).
[45] K. Ahn, C. Li, C. Uher and M. G. Kanatzidis, *Chem. Mater.*, 21, 1361, (2009).
[46] E. A. Skrabek and D. S. Trimmer, In *CRC Handbook of 63 Thermoelectrics*, Ed. by Rowe D M; CRC Press: Boca Raton, Fla., 1995; p 272
[47] I. Kudman, *Metall. Trans.*, 2 163 (1971).
[48] M. Zhou, J. Li and T. Kita, *J. Am. Chem. Soc.*, 130, 4527, (2008).

What is claimed is:

1. A compound of the formula $Na_xPb_{1-x}Se$, wherein $0.005 \leq x \leq 0.025$, and wherein density of the compound is 98% or greater of the theoretical value, and $3 \times 10^{19}$ cm$^{-3} \leq n_H \leq 3 \times 10^{20}$ cm$^{-3}$.

2. The compound of claim 1, wherein the composition has a maximum thermoelectric figure of merit (zT) of greater than 1.3 at 850 K.

3. A thermoelectric material comprising a compound of the formula $Na_xPb_{1-x}Se$, wherein $0.005 \leq x \leq 0.025$, and wherein density of the compound is 98% or greater of the theoretical value, and $3 \times 10^{19}$ cm$^{-3} \leq n_H \leq 3 \times 10^{20}$ cm$^{-3}$.

4. The thermoelectric material of claim 3, wherein the composition has a maximum thermoelectric figure of merit (zT) of greater than 1.3 at 850 K.

* * * * *